United States Patent [19]
Takabatake et al.

[11] Patent Number: 5,327,268
[45] Date of Patent: Jul. 5, 1994

[54] REFLECTIVE TYPE LIQUID CRYSTAL DISPLAY WITH REVERSELY STAGGERED TFT STRUCTURES

[75] Inventors: Masaru Takabatake, Mobara; Yuji Mori, Ibaraki; Yoshiharu Nagae, Hitachi, all of Japan

[73] Assignee: Hitachi, Ltd., Tokyo, Japan

[21] Appl. No.: 18,135

[22] Filed: Feb. 18, 1993

[30] Foreign Application Priority Data

Feb. 19, 1992 [JP] Japan .................................. 4-032210

[51] Int. Cl.$^5$ ........................................... G02F 1/1343
[52] U.S. Cl. ......................................... 359/59; 359/57
[58] Field of Search ....................... 359/59, 57; 257/57, 257/347

[56] References Cited

U.S. PATENT DOCUMENTS

| | | | |
|---|---|---|---|
| 4,979,006 | 12/1990 | Tanaka et al. | 257/347 |
| 5,005,056 | 4/1991 | Motai et al. | 257/52 |
| 5,027,226 | 6/1991 | Nagata et al. | 358/482 |
| 5,047,819 | 9/1991 | Tanaka et al. | 359/59 |
| 5,053,354 | 10/1991 | Tanaka et al. | 437/101 |
| 5,114,869 | 5/1992 | Tanaka et al. | 257/57 |
| 5,136,358 | 8/1992 | Sakai et al. | 257/57 |
| 5,202,575 | 4/1993 | Sakai | 257/292 |
| 5,240,848 | 8/1993 | Keck et al. | 435/240.2 |
| 5,247,289 | 9/1993 | Matsueda | 359/59 |
| 5,264,728 | 11/1993 | Ikeda et al. | 359/87 |

FOREIGN PATENT DOCUMENTS

| | | | |
|---|---|---|---|
| 61-191072 | 8/1986 | Japan . | |
| 62-214670 | 9/1987 | Japan . | |
| 4-335320 | 11/1992 | Japan | 359/68 |
| 5-045640 | 2/1993 | Japan | 359/79 |

OTHER PUBLICATIONS

Powell et al, "Characteristics of Anorphous Silicon Staggered-Electrode Thin-Film Transistors", Appl. Phys. Lett., vol. 45, No. 2 (Jul. 1984).
Suzuki et al, "High-Resolution Transparent-Type a-Si TFT LCDs", Society for Information Display 83 Digest, (1983), pp. 146-147.

Primary Examiner—Anita P. Gross
Attorney, Agent, or Firm—Antonelli, Terry, Stout & Kraus

[57] ABSTRACT

An active matrix reflective type liquid crystal display is provided which is obtained by an easy alignment of the respective layers of the display, and the use of small TFTs and a reduced number of manufacturing steps. Each TFT comprises a drain electrode which comprises an area where a scanning conductor and a signal conductor concerned intersect, a source electrode which comprises an area where a short-circuiting conductor concerned parallel to the signal conductor and the associated scanning conductor concerned intersect, a gate electrode which comprises an area provided between the drain and source electrodes concerned on the scanning conductor and a reflective electrode concerned provided at an end of the short-circuiting conductor concerned.

11 Claims, 19 Drawing Sheets

REFLECTIVE TYPE LIQUID CRYSTAL DISPLAY WITH REVERSELY STAGGERED TFT STRUCTURES

BACKGROUND OF THE INVENTION

The present invention relates to liquid crystal displays and more particularly to an active matrix reflective type liquid crystal display.

An active matrix reflective type liquid crystal display is provided with reflective electrodes controlled by thin film transistors (TFTs), an opposing common electrode and a liquid crystal disposed between those electrodes to change the optical transmission state of the liquid crystal layer with a voltage applied across both the electrodes to control the strengths of the light reflected by the reflective electrodes for displaying purposes.

The reflective type liquid crystal display uses TFTs used in a regular active matrix transmission type liquid crystal display disclosed in "Society for Information Display 83 Digest 1983", pp. 146–147.

In this conventional reflective type liquid crystal display using TFTs, the alignment of the gate electrodes of the TFTs and the intrinsic semiconductor films and the alignment of the intrinsic semiconductor films and the drain and source electrodes are required. The alignment involves errors, so that the designed dimensions of the respective elements concerned have predetermined dimensional margins in consideration of the errors. Thus, there is the problem that the size of the TFTs is large. The number of process steps required is large and a considerable time is required for the alignment of the respective layers concerned.

SUMMARY OF THE INVENTION

It is an object of the present invention to provide an active matrix reflective type liquid crystal display which solves the problems with the TFTs used in the conventional active matrix reflective type crystal display, and which is obtained by easy alignment in the manufacture of the TFTs, the use of small TFTs and a reduced number of steps of manufacturing such display.

According to the present invention, the above object is achieved by a thin film transistor having a reversely staggered structure where the transistor has a drain electrode which comprises an area where a scanning conductor and a signal conductor intersect, a source electrode which comprises an area where a short-circuiting conductor parallel to the signal conductor and having a length larger than the width of the scanning conductor and the scanning conductor intersect, a gate electrode which comprises a region formed between the drain and source electrodes on the scanning conductor, and a region of an intrinsic semiconductor formed so as to include the gate electrode such that the gate electrode coincides with a channel region.

If the signal conductor and short-circuiting conductor can be formed with the same photomask, the positional relationship between the drain electrode formed in the area where the scanning conductor and the signal conductor intersect, the source electrode formed in the area where the short-circuiting conduct or and the scanning conductor intersect and the gate electrode formed between the drain electrode and source electrode is determined with an accuracy of photomask design even if the positional relationship between the scanning conductor and each of the scanning conductor and the short-circuit conductor deviates vertically or horizontally somewhat in the alignment of those conductors. The formation of the intrinsic semiconductor film area which includes the gate electrode serves to cause the channel region and the gate electrode to completely coincide with each other. Eventually, the positional relationship between the source and drain electrodes and channel regions which influence the characteristic of the TFTs is maintained within an accuracy determined by that of the photomask design even if there is a deviation in the alignment performed in the manufacture.

DESCRIPTION OF THE PREFERRED EMBODIMENTS

Embodiments of an active matrix reflective type liquid crystal display driven by thin film transistors (TFTs) according to the present invention will be described below in detail with respect to the drawings. In the embodiments, the structure of a substrate on which an TFT and reflective electrodes are provided (hereinafter referred to as a TFT substrate) and a method of making the substrate will below be described mainly.

Figure 3:
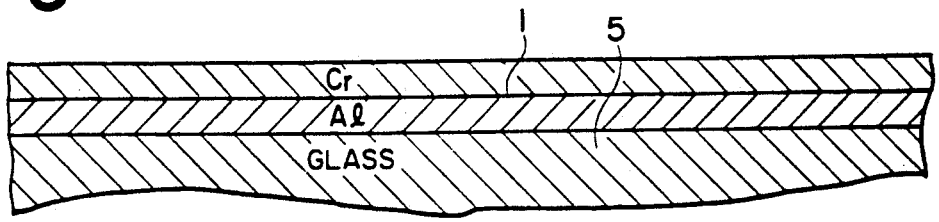
FIG. 3 is a cross-sectional view showing one of the steps of manufacturing the first embodiment.

FIGS. 1A-1D show patterns of a first embodiment of the active matrix reflective type liquid crystal display according to the present invention at its manufacturing steps. FIGS. 2A, B and C are cross-sectional views taken along the lines IIA1—IIA1, IIB1—IIB1 and IIC1—IIC1, respectively, of FIG. 1D. FIGS. 3-9 shows the respective steps of manufacturing the first embodiment. FIG. 10 is a plan view of a matrix-like TFT substrate. The method of making the TFT substrate of the first embodiment is as follows:

1) Al (aluminum) and Cr (=Cr/Al) which will be a gate electrode 1 are deposited on a glass substrate 5 and the resulting substrate is patterned with one mask. At this time, a storage capacitance (Cstg) electrode 6 is formed (FIGS. 1A and 3).

Figure 4:
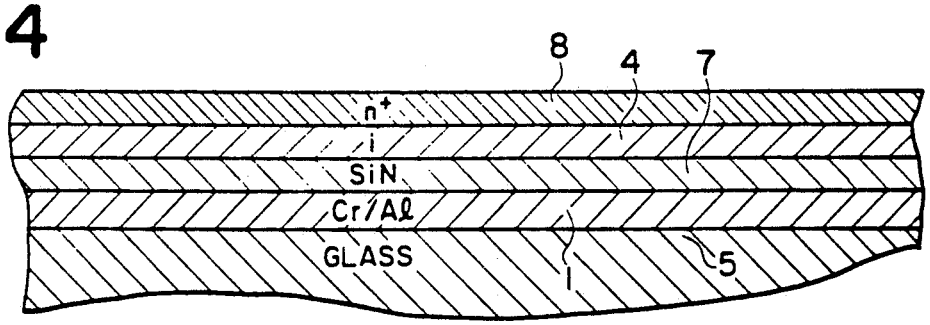
FIG. 4 is a cross-sectional view showing one of the steps of manufacturing the first embodiment.

2) Thereafter, a SiN film 7 which will be a gate insulating film, an intrinsic semiconductor film (i layer) 4, and an extrinsic semiconductor film (n+layer) 8 are sequentially deposited. Thereafter, the n+layer 8 and i layer 4 are sequentially patterned with back exposure (FIGS. 1A, 4).

Figure 1A:
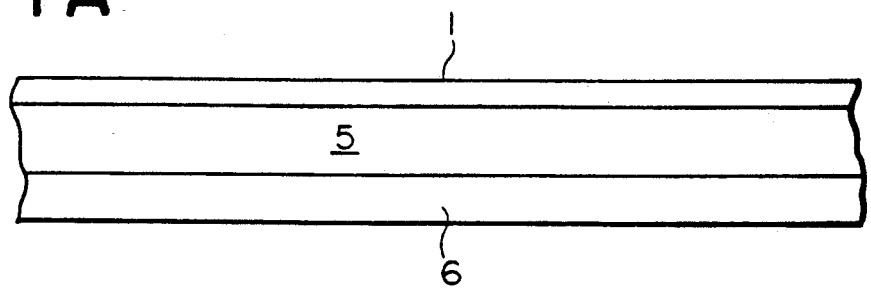
FIGS. 1A–1D are plan views showing patterns of a TFT substrate in a first embodiment of an active matrix reflective type liquid crystal display according to the present invention at its manufacturing steps.
Figure 1B:
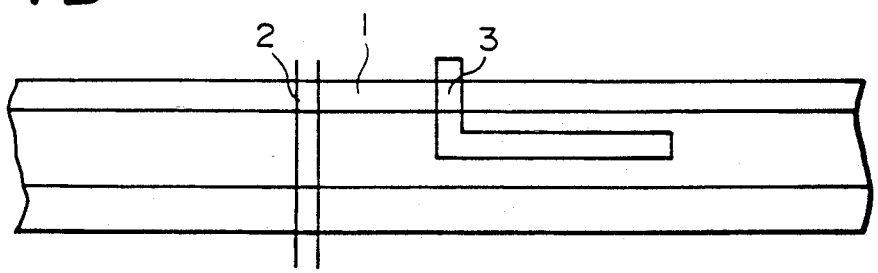
Figure 2A:
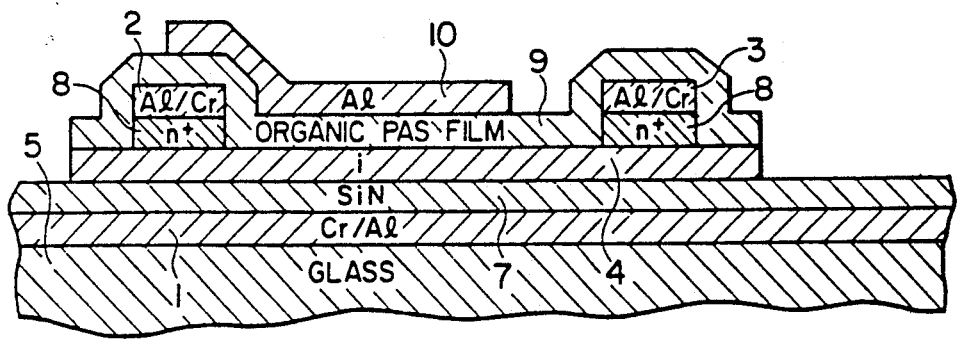
FIGS. 2A, B and C are cross-sectional views taken along the line IIA1—IIA1, IIB1—IIB1 and IIC1—IIC1, respectively, showing cutting along perpendicular direction away from the surface of FIG. 1D.
Figure 2B:
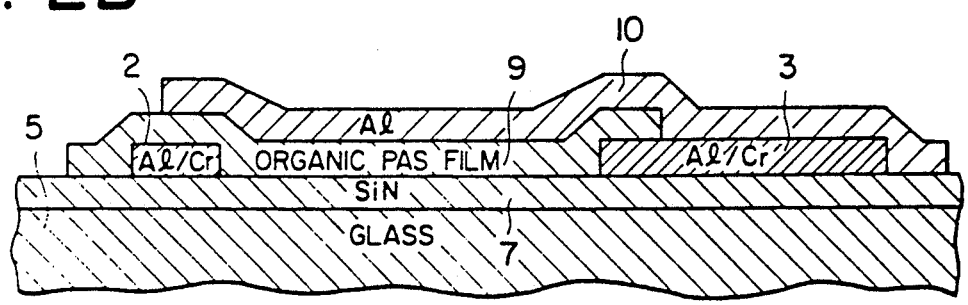
Figure 2C:
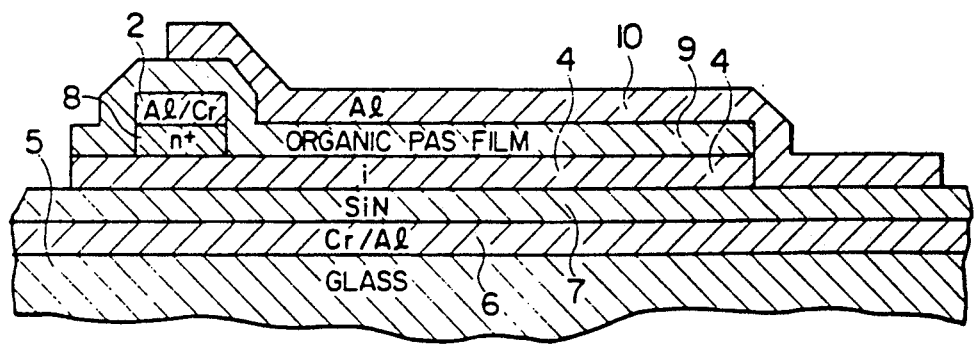
Figure 5:
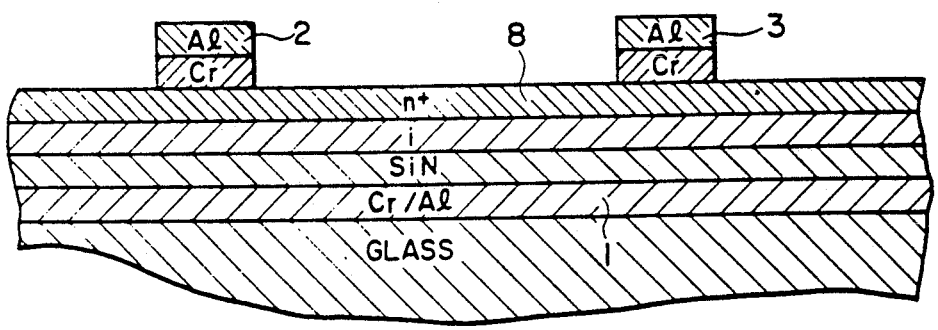
FIG. 5 is a cross-sectional view showing one of the steps of manufacturing the first embodiment.
Figure 6:
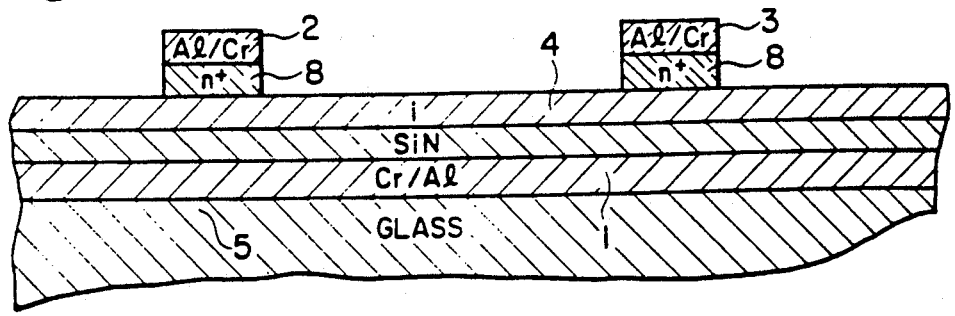
FIG. 6 is a cross-sectional view showing one of the steps of manufacturing the first embodiment.

3) Thereafter, Cr and Al (=Al/Cr) which will be a drain electrode 2 and a source electrode 3 are deposited and the Al/Cr electrodes 2, 3 and the n+layer 8 are sequentially patterned with one mask (FIGS. 1A, 5 and 6).

Figure 1C:
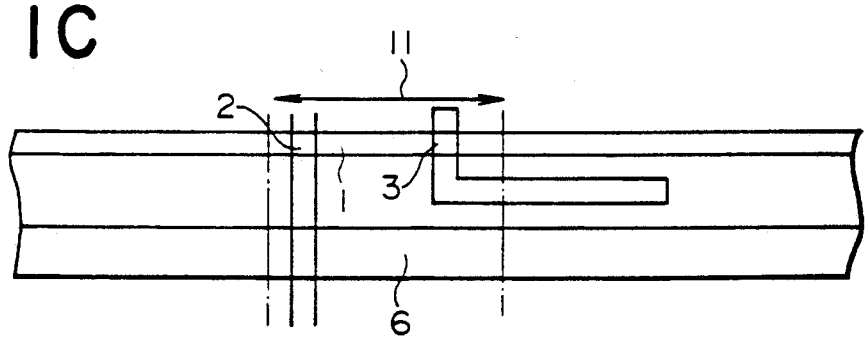
Figure 7:
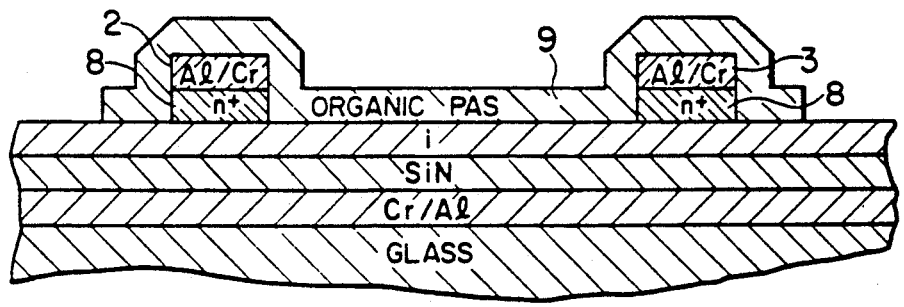
FIG. 7 is a cross-sectional view showing one of the steps of manufacturing the first embodiment.

4) Thereafter, an organic PAS (Passivation) film 9 which will be a protective film for the TFT is deposited and the film 9 and layer 4 are sequentially patterned with one mask (FIGS. 1C, 7).

Figure 8:
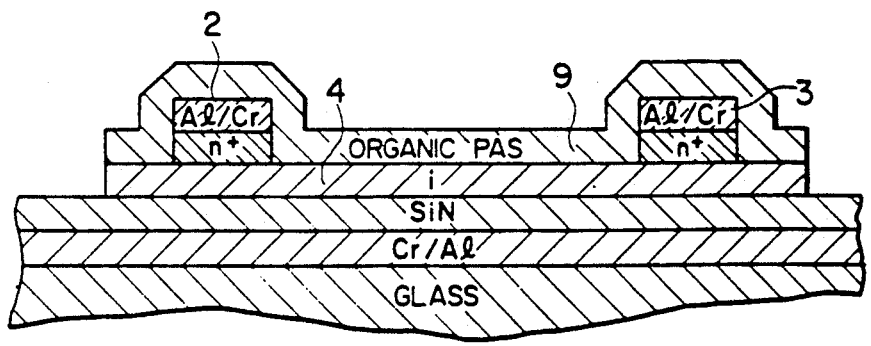
FIG. 8 is a cross-sectional view showing one of the steps of manufacturing the first embodiment.

5) Thereafter, the SiN film 7 of a terminal section is patterned with one mask for leading the gate electrode (FIGS. 1A, 8).

Figure 1D:
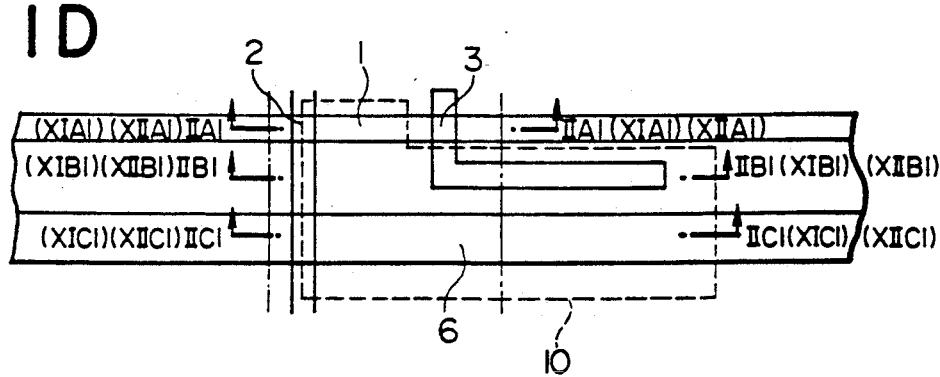
Figure 9:
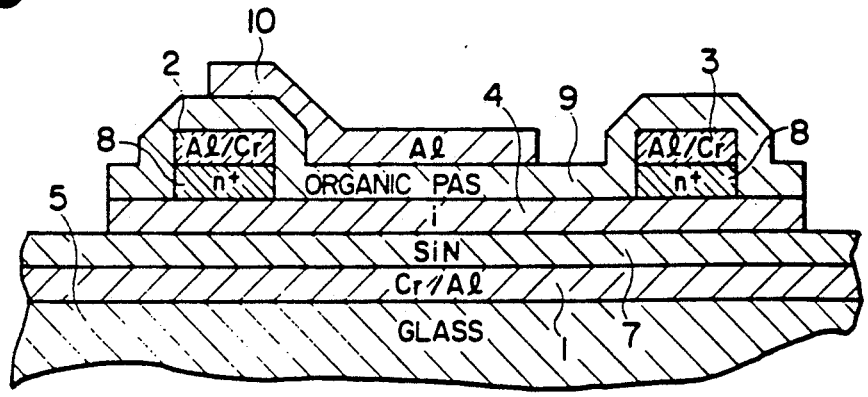
FIG. 9 is a cross-sectional view showing one of the steps of manufacturing the first embodiment.
Figure 10:
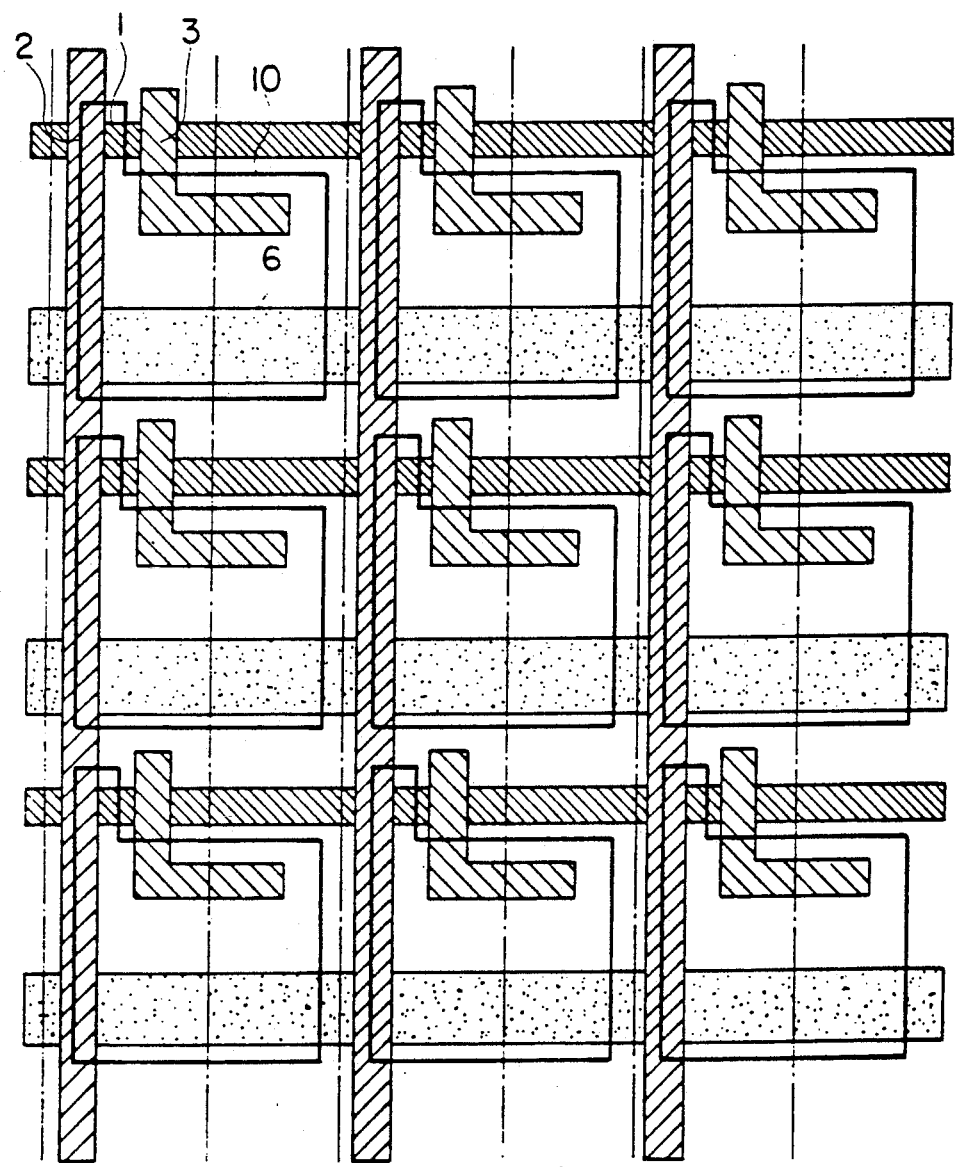
FIG. 10 is a plan view of a matrix-like TFT substrate in the present invention.

6) Thereafter, Al 10 which will be a reflective electrode is deposited and patterned with one mask (FIGS. 1D, 9).

A region 11 of FIG. 1C shows a region where the organic PAS film 9 exists. Unevenness of a surface of such area where the organic PAS film exists is reduced due to the organic PAS film.

As will be seen in FIG. 1C, in the pattern of the first embodiment, drain and source electrodes 2 and 3 are formed in an area where the scanning conductor which will be the gate electrode 1, the signal conductor which will be the drain electrode 2 simply overlap and an area where the scanning conductor and the short-circuiting conductor which will be the source electrode 3 simply overlap. The gate electrode 1 is formed between the drain and source electrodes 2 and 3. As a result, the width of the gate electrode 1 will be the width of the channel. Thus, alignment of the respective layers is very easy and the manufactured TFTs has high accuracy and reduced unevenness. No error in the alignment is required to be taken into consideration in the design of the TFTs to thereby reduce the size of the TFTs.

In this process, the TFT substrate is made with four masks, inclusive of a mask for leading the gate electrode to thereby improve throughput. The features of the device structure are that the intrinsic semiconductor layer 4 is necessarily provided directly below the insulating film 9 as the protective film for the TFT provided on the gate electrode 1. As will be seen in FIG. 1D, the storage capacitance Cstg is formed between the Al 10 and the Cstg electrode 6 in the first embodiment.

Figure 11A:
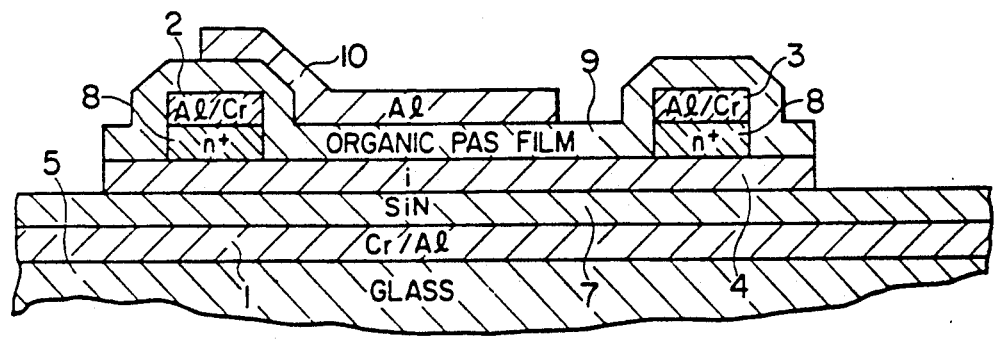
FIGS. 11A, 11B and 11C are cross-sectional views of a TFT substrate of a second embodiment of the present invention taken along the lines XIA1—XIA1, XIB1—XIB1 and XIC1-XIC2, respectively, showing cutting along in perpendicular direction away from the surface of FIG. 1D.

In the reflective type liquid crystal display, the storage capacitance is formed on the back of the reflective electrode, a reduction in the vignetting factor due to the presence of the storage capacitance which would occur in a transmission type liquid crystal display is not required to be cared about. Therefore, regions other than those for the TFTs and conductors can be used as ones where the storage capacitance is formed. As mentioned above, if the area of the TFTs is reduced, the area of the storage capacitance can be increased accordingly to thereby increase the storage capacitance value Cstg. A hold time for which a pixel voltage is held by the storage capacitance is proportional to the product of the Cstg and the liquid crystal resistance, so that when the hold time is constant, an increase in the Cstg implies that even a liquid crystal which has a small resistivity is usable. Thus, a range of liquid crystal materials selected increases advantageously. FIGS. 11A, B and C are cross-sectional views of a second embodiment of the present invention taken along the lines XIA1—XIA1, XIB1—XIB1 and XIC1—XIC1, respectively, of FIG.

1D. A method of making a TFT substrate of the second embodiment is as follows:

1) Al and Cr (=Cr/Al) which will be a gate electrode 1 are deposited on a glass substrate 5 and the resulting substrate is patterned with one mask.
2) Thereafter, a SiN film 7 which will be a gate insulating film, an intrinsic semiconductor film (i layer) 4, and an extrinsic semiconductor film (n+layer) 8 are sequentially deposited.
3) Thereafter, Cr and Al (=Al/Cr) which will be a drain electrode 2 and a source electrode 3 are deposited and the Al/Cr electrodes 2, 3 and the n+layer 8 are sequentially patterned with one mask.
4) Thereafter, an organic PAS film 9 which will be a protective film for the TFT is deposited and the film 9 and layer 4 are sequentially patterned with one mask.
5) Thereafter, the SiN film 7 of a terminal section is patterned with one mask for leading the gate electrode.
6) Thereafter, Al 10 which will be a reflective electrode is deposited and patterned with one mask.

Figure 11B:
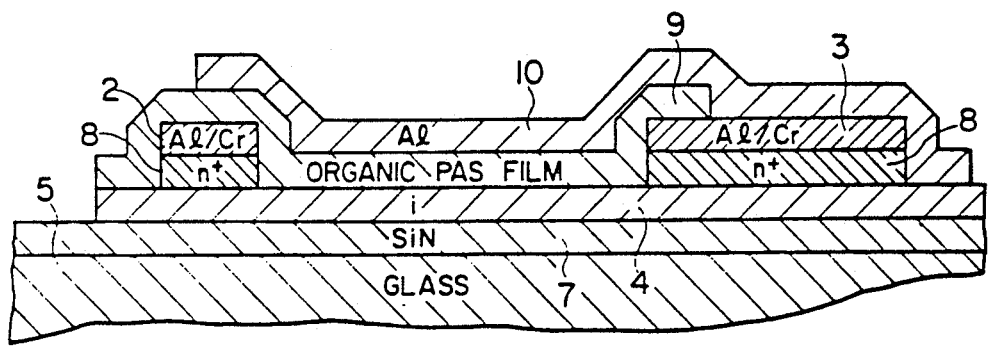
Figure 11C:
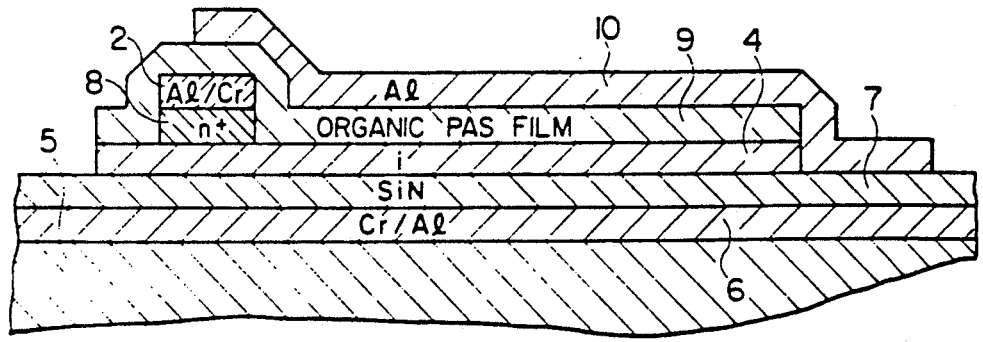

The second embodiment is obtained by omitting back exposure such as is performed in the first embodiment. As will be seen in FIG. 11B, an n+layer 8 and the i layer 4 also are necessarily provided directly below the drain electrode 2 in the cross-sectional structure of the second embodiment. As a result, a surface of the substrate is flattened to thereby reduce the percentage of breakage of the conductor for the drain electrode 2. Omission of the back exposure improves the throughput accordingly. In the process, the TFT substrate is made with four masks, inclusive of a mask for leading the gate electrode. Thus, the throughput is increased.

Figure 12A:
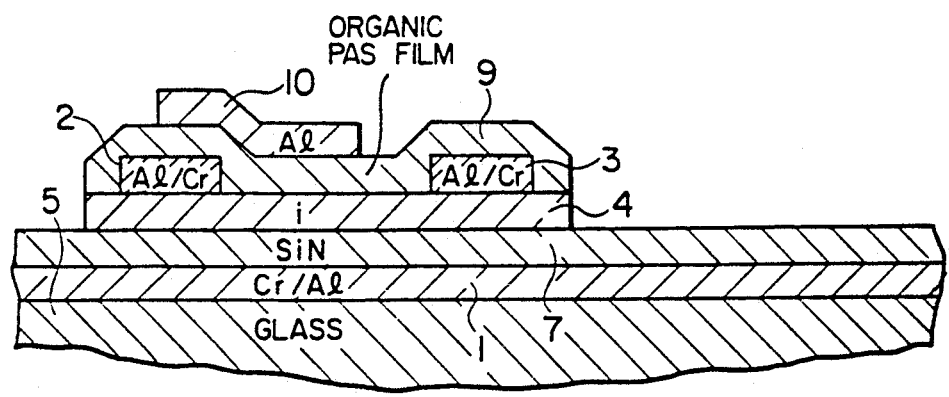
FIGS. 12A, B and C are cross-sectional views of a TFT substrate of a third embodiment of the present invention taken along the line XIIA1—XIIA1, XIIB1—XIIB1 AND XIIC1—XIIC1, respectively, showing cutting along in perpdnciular direction away from the surface of FIG. 1D.
Figure 12B:
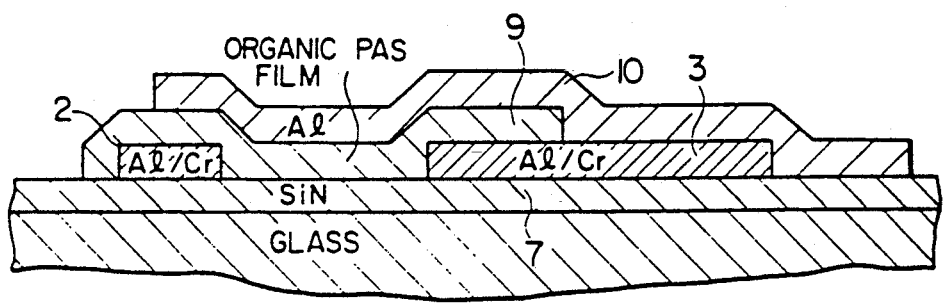
Figure 12C:
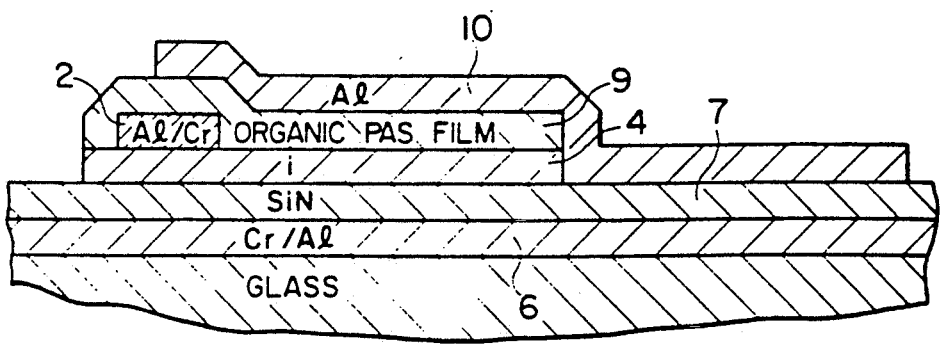

FIGS. 12A, B and C are cross-sectional views of a third embodiment of the present invention taken along the lines XIIA1—XIIA1, XIIB1—XIIB1 and XIIC1—XIIC1, respectively, of FIG. 1D. A method of making a TFT substrate of the third embodiment is as follows:

1) Al and Cr (=Cr/Al) which will be a gate electrode 1 are deposited on a glass substrate 5 and the resulting substrate is patterned with one mask.
2) Thereafter, a SiN film 7 which will be a gate insulating film and an intrinsic semiconductor film (i layer) 4 are deposited, and the i layer 4 is patterned with back exposure.
3) Thereafter, Cr and Al (=Al/Cr) which will be a drain electrode 2 and a source electrode 3 are deposited and the Al/Cr electrodes 2, 3 are patterned with one mask.
4) Thereafter, an organic PAS film 9 which will be a protective film for the TFT is deposited and the film 9 and layer 4 are sequentially patterned with one mask.
5) Thereafter, the SiN film 7 of a terminal section is patterned with one mask for leading the gate electrode.
6) Thereafter, Al 10 which will be a reflective electrode is deposited and patterned with one mask.

The third embodiment is obtained by omitting disposition of an n+layer 9 such as is present in the first embodiment. Since in the third embodiment no n+ layer 9 is used, the i layer 4 is thinned greatly and hence a leak current from the TFT is reduced. This embodiment is advantageous for improvements to the field effect mobility using laser annealing. The throughput is improved according to the omission of the deposition of the n+layer 9. In this process, the TFT substrate is made with four masks, inclusive of a mask for leading the gate electrode to thereby improve the throughput.

Figure 13A:
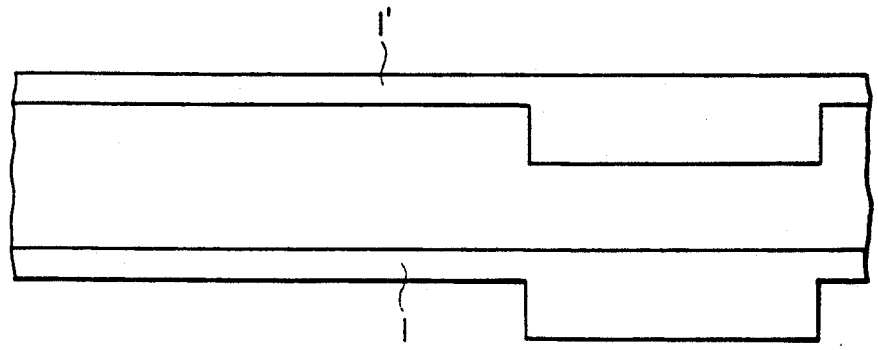
FIGS. 13A, B and C are plan views showing patterns of a TFT substrate of a fourth embodiment according to the present invention at the respective manufacturing steps.
Figure 13B:
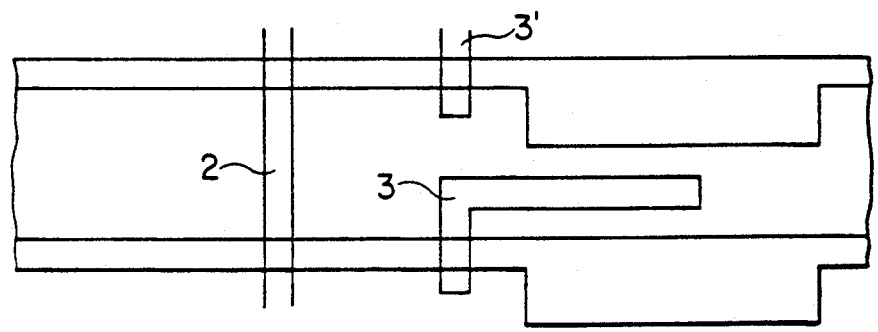
Figure 13C:
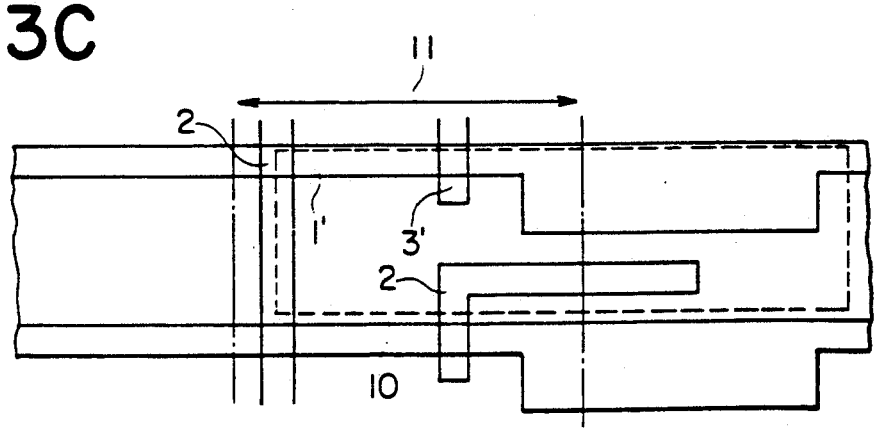

FIGS. 13A-C show patterns of a fourth embodiment of the present invention at its respective manufacturing steps. The feature of this embodiment is the formation of a storage capacitance Cstg between Al 10 for the reflective electrode and a gate electrode 1' of the directly previous stage.

Figure 14A:
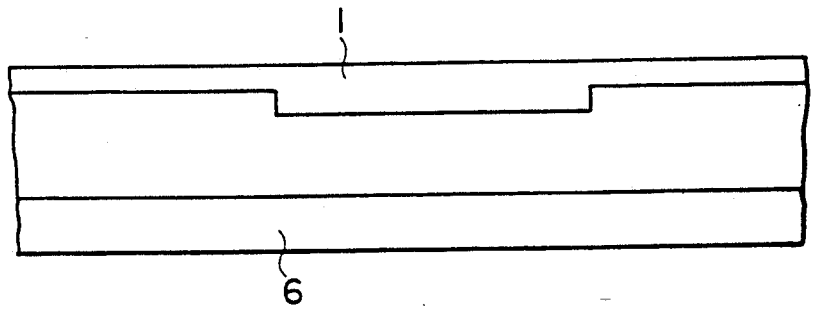
FIGS. 14A, B and C are plan views showing patterns of a TFT substrate of a fifth embodiment according to the present invention at the respective manufacturing steps.
Figure 14B:
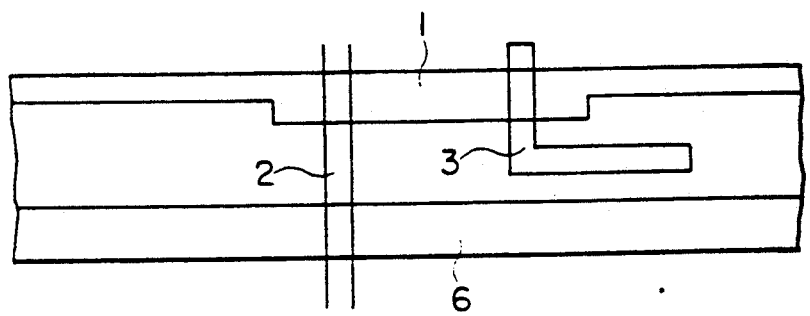
Figure 14C:
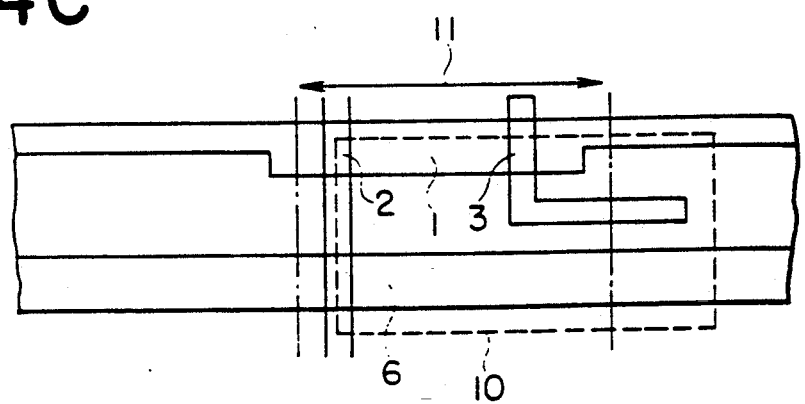

FIGS. 14A-C show patterns of a fifth embodiment of the present invention at its respective manufacturing steps. The feature of this embodiment is an increase in the width of the gate electrode 1 alone in the vicinity of a TFT formed to thereby improve the ability to drive the TFT.

Figure 15A:
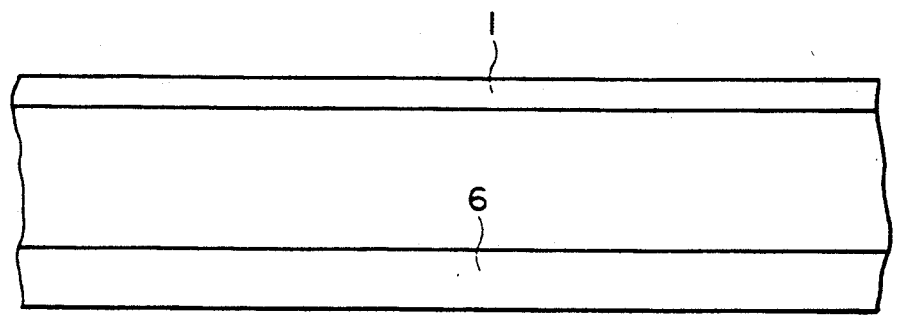
FIGS. 15A and B are plan views showing patterns of a TFT substrate of a sixth embodiment according to the present invention at the respective manufacturing steps.

FIGS. 15A, B show patterns of a sixth embodiment of the present invention at its manufacturing steps. FIGS. 16A, B and C are cross-sectional views of the sixth embodiment of the present invention taken along the lines XVIA2—XVIA2, XVIB2—XVIB2 and XVIC2—XVIC2, respectively, of FIG. 15B. A method of making a TFT substrate of the sixth embodiment is as follows:

1) Al and Cr (=Cr/Al) which will be a gate electrode 1 are deposited on a glass substrate 5 and the resulting substrate is patterned with one mask.
2) Thereafter, a SiN film 7 which will be a gate insulating film, an intrinsic semiconductor film (i layer) 4 and an extrinsic semiconductor film (n+layer) 8 are sequentially deposited, and the n+layer 8 and the i layer 4 are sequentially patterned with back exposure.
3) Thereafter, Cr and Al (=Al/Cr) which will be a drain electrode 2 and a source electrode 3 are deposited and the Al/Cr electrodes 2, 3 and the n+layer 8 are sequentially patterned with one mask.
4) Thereafter, an organic PAS film 9 which will be a protective film for the TFT is deposited and the film 9 is patterned with one mask.
5) Thereafter, the i layer 4 and SiN film 7 of a terminal section are patterned with one mask for leading the gate electrode.

In the sixth embodiment, the source electrode 3 is used directly as a reflective electrode, so that the number of masks is reduced by one. As will be seen in FIG. 15B, the TFT is formed by causing the gate electrode 1 to overlap with each of the drain electrode 2 and source electrode 3 in the pattern of the sixth embodiment. As a result, the width of the gate electrode 1 becomes the width of the channel. Thus, alignment of the respective layers is greatly facilitated to thereby improve the throughput. In the process, the TFT substrate is made with four masks, inclusive of a mask for leading the gate electrode. Therefore, the throughput is improved. As will be seen in FIG. 15, the storage capacitance Cstg is formed between the source electrode (Al/Cr) 3 and the Cstg electrode 6 in the sixth embodiment.

Figure 15B:
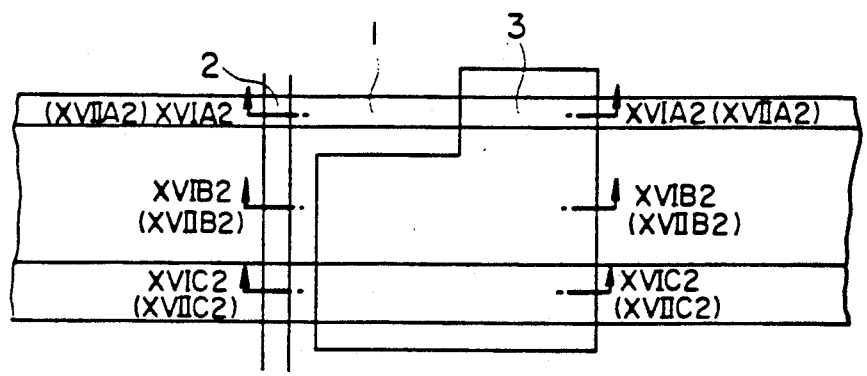
Figure 16A:
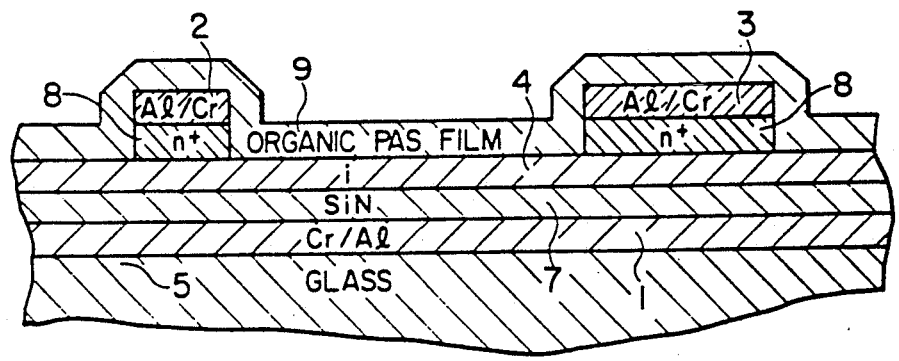
FIGS. 16A, B and C are cross-sectional views of a TFT substrate of a sixth embodiment of the present invention taken along the lines XVIA2—XVIA2, XVIB2—XVIB2 AND XVIC2—XVIC2, respectively, showing cutting along perpendicular direction away from the surface of Fig. 15B.
Figure 16B:
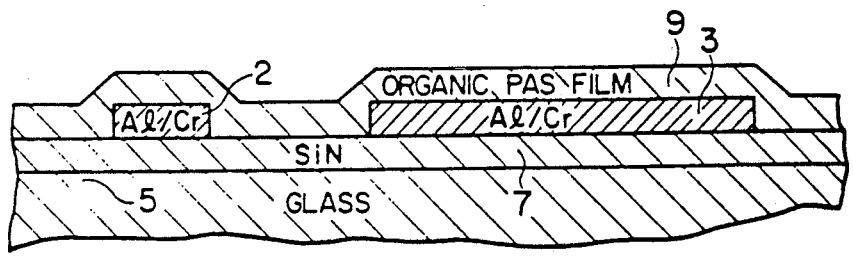
Figure 16C:
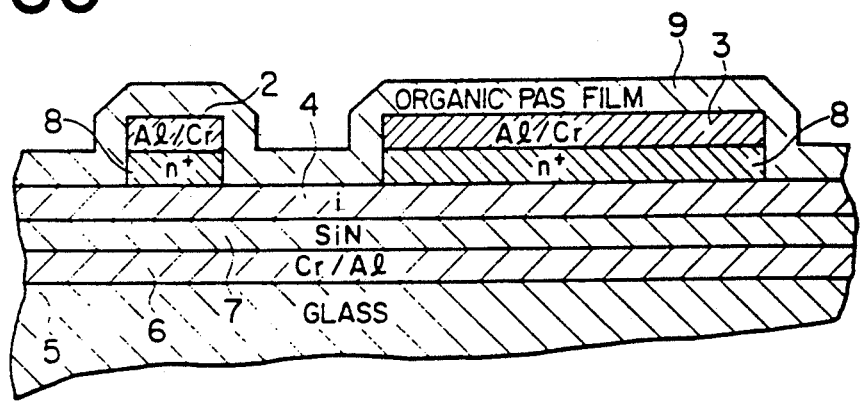
Figure 17A:
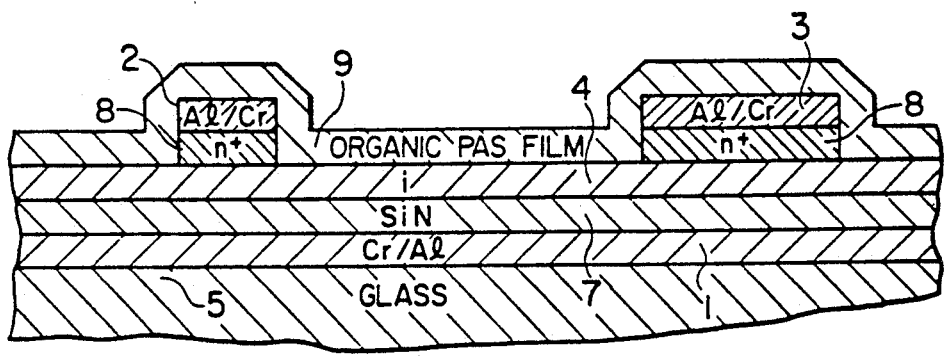
FIGS. 17A, B and C are cross-sectional views of a TFT substrate of a seventh embodiment of the present invention taken along the line XVIIA2—XVIIA2, XVIIB2—XVIIB2 AND XVIIC2—XVIIC2, respectively, showing cutting along perpendicular direction away from the surface of FIG. 15B.
Figure 17B:
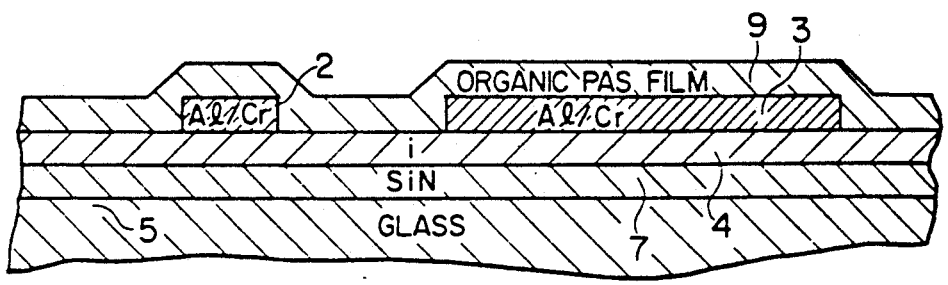
Figure 17C:
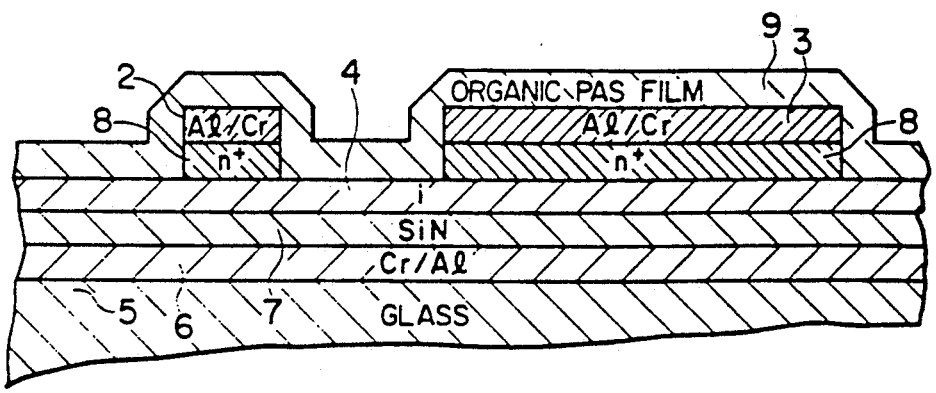

FIGS. 17A, B and C are cross-sectional views of the seventh embodiment of the present invention taken along the lines XVIIA2—XVIIA2, XVIIB2—XVIIB2 and XVIIC2—XVIIC2, respectively, of FIG. 15B. A method of making a TFT substrate of the seventh embodiment is as follows:

1) Al and Cr (=Cr/Al) which will be a gate electrode 1 are deposited on a glass substrate 5 and the resulting substrate is patterned with one mask.

2) Thereafter, a SiN film 7 which will be a gate insulating film, an intrinsic semiconductor film (i layer) 4 and an extrinsic semiconductor film (n+layer) 8 are sequentially deposited, and the n+layer 8 is patterned with back exposure.
3) Thereafter, Cr and Al (=Al/Cr) which will be a drain electrode 2 and a source electrode 3 are deposited and the Al/Cr electrodes 2, 3 and the n+layer 8 are sequentially patterned with one mask.
4) Thereafter, an organic PAS film 9 which will be a protective film for the TFT is deposited and patterned with one mask.
5) Thereafter, the i layer 4 and SiN film 7 of a terminal section are patterned with one mask for leading the gate electrode.

The seventh embodiment is obtained by omitting a process such as the back exposure for the i layer 4 performed in the sixth embodiment. As will be seen in FIG. 17A, the i layer is necessarily provided directly below the drain electrode 2 in the cross-sectional structure of the seventh embodiment. As a result, the substrate surface is flattened and a percentage of breakage of the drain electrode 2 is reduced. The throughput is improved according to the omission of exposure on the back of the i layer 4. In the process, the TFT substrate is made with four masks, inclusive of a mask leading the gate electrode to thereby improve the throughput.

Figure 18A:
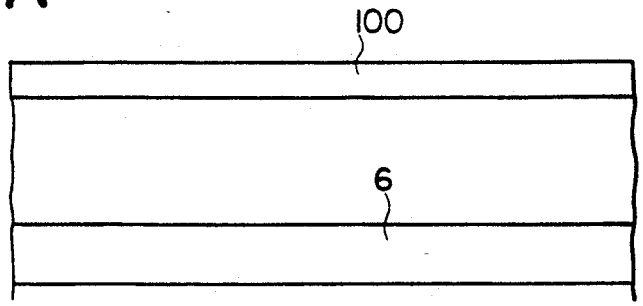
FIGS. 18A, B, C and D are plan views showing patterns of a TFT substrate of an eighth embodiment according to the present invention at the respective manufacturing steps.
Figure 18B:
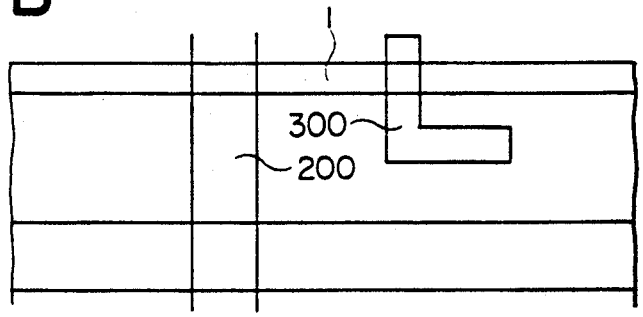
Figure 18C:
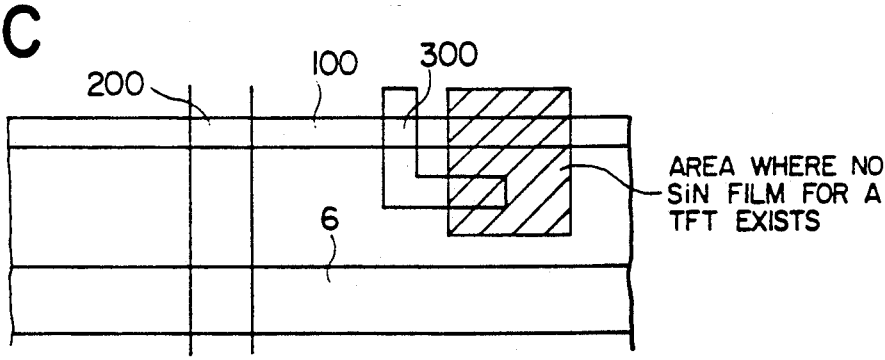

FIGS. 18A, B, C and D show patterns of an eighth embodiment of the present invention at its manufacturing steps. FIGS. 19A, B and C are cross-sectional views of the eighth embodiment of the present invention taken along the lines XIXA3—XIXA3, XIXB3—XIXB3 and XIXC3—XIXC3, respectively, of FIG. 18D. A method of making a TFT substrate of the eighth embodiment is as follows:

1) Cr which will be a gate electrode 100 is deposited on a glass substrate 5 and the resulting substrate is patterned with one mask.
2) Thereafter, a SiN film 7 which will be a gate insulating film, an intrinsic semiconductor film (i layer) 4 and an extrinsic semiconductor film (n+layer) 8, and Al-Si which will be a drain electrode 200 and a source electrode 300 are sequentially deposited, and the Al-Si electrodes 200, 300 and the n+layer 8 are sequentially patterned with one mask.
3) Thereafter, an organic PAS film 9 is printed, and an i layer 4 and a SiN film 7 which will be a gate insulating film are sequentially patterned with the PAS film 7 as a mask.
4) Thereafter, Al 10 which will be a reflective electrode is deposited and patterned with one mask.

Figure 18D:
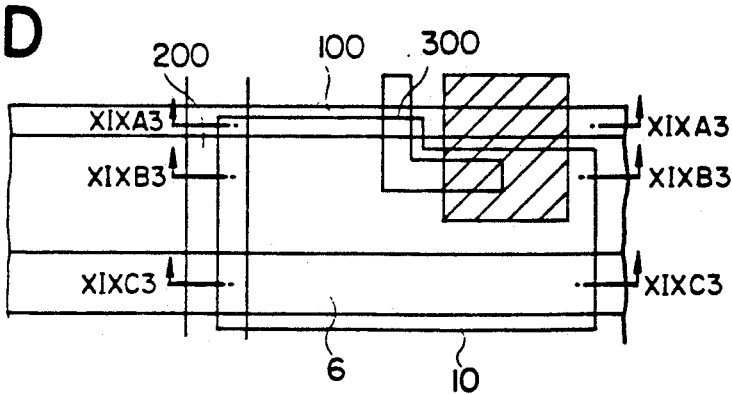
Figure 19A:
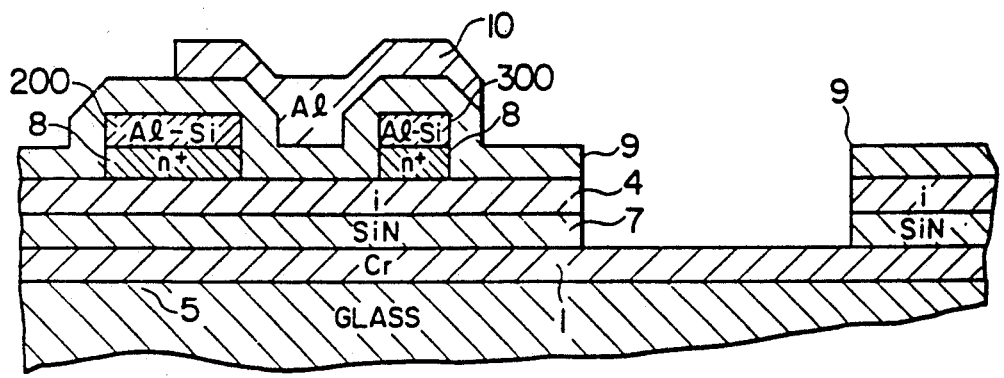
FIGS. 19A, B and C are cross-sectional views of a TFT substrate of the eighth embodiment taken along the line XIXA3—XIXA3, XIXB3—XIXB3 AND XIXC3—XIXC3, respectively, showing cutting along perpendicular direction away from the surface of FIG. 18D.
Figure 19B:
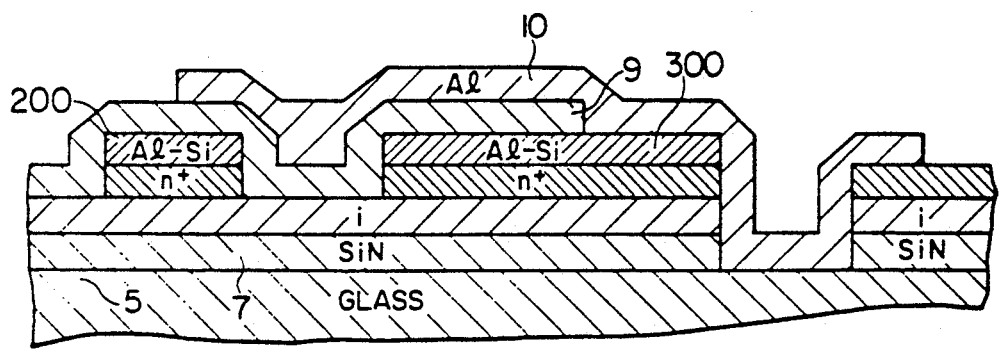
Figure 19C:
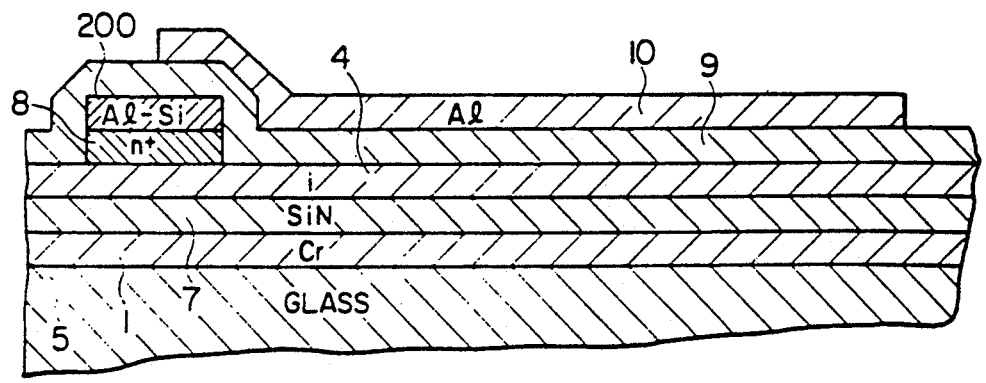

As will be seen in FIG. 18D, a TFT is formed by only causing the gate electrode 100 and each of the drain and source electrodes 200 and 300. In the process, a terminal section of the gate electrode 100 is exposed by patterning the SiN film 7 which will be an gate insulating film with the organic PAS film 9 as a mask. Thus, in the process, the TFT is formed with four masks, inclusive 20 of a mask for leading the gate electrode.

Figure 20A:
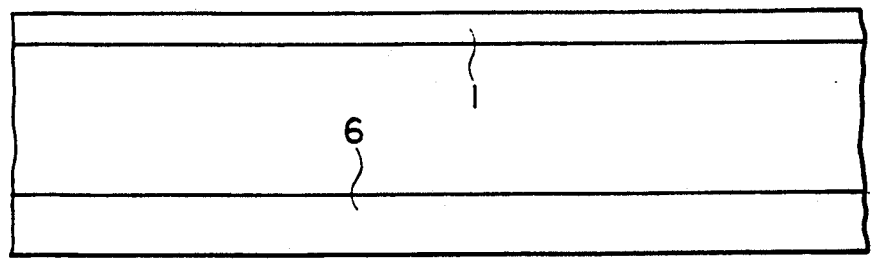
FIGS. 20A, B and C are plan views showing patterns of a TFT substrate of a ninth embodiment according to the present invention at the respective manufacturing steps.
Figure 20B:
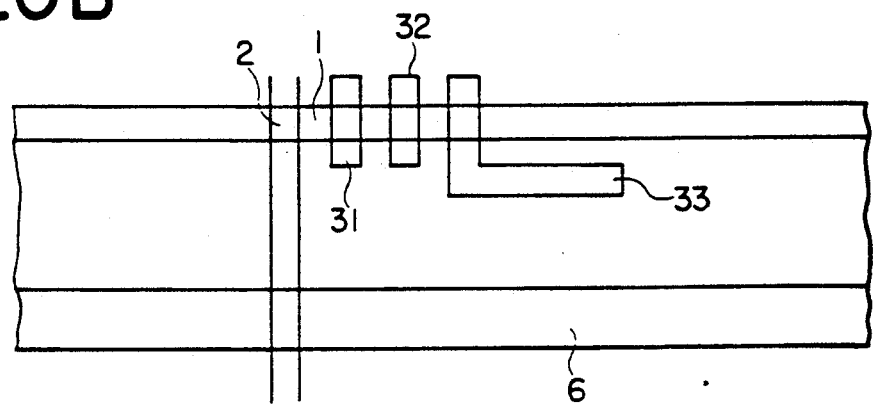
Figure 20C:
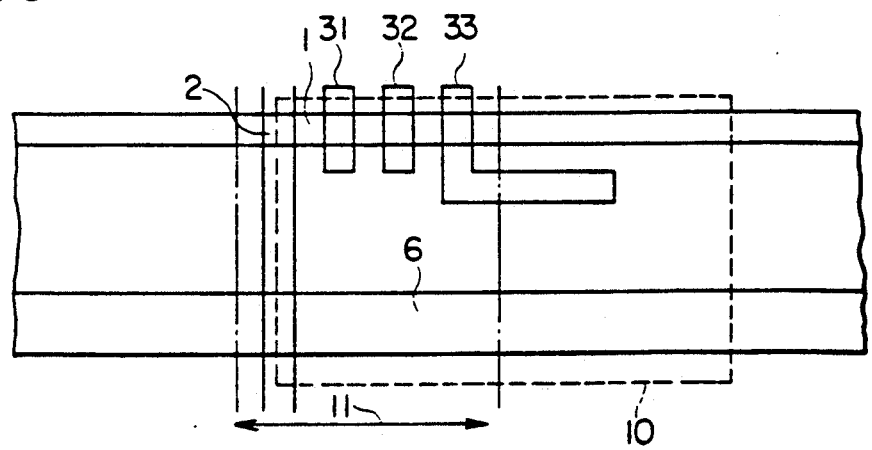

FIGS. 20A-C show patterns of a ninth embodiment of the present invention at its respective manufacturing steps. The feature of the ninth embodiment is the series connection of TFTs based on juxtaposition of the first, second and third source electrodes 31, 32 and 33 on the gate electrode 1 to thereby reduce a leak current from the TFTs.

Figure 21A:
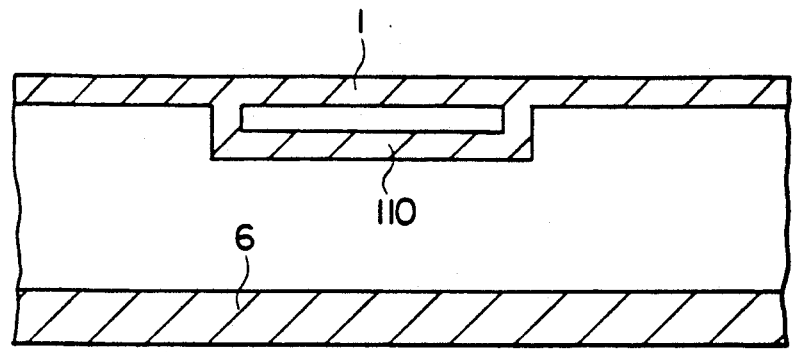
FIGS. 21A, B and C are plan views showing patterns of a TFT substrate of a tenth embodiment according to the present invention at the respective manufacturing steps.
Figure 21B:
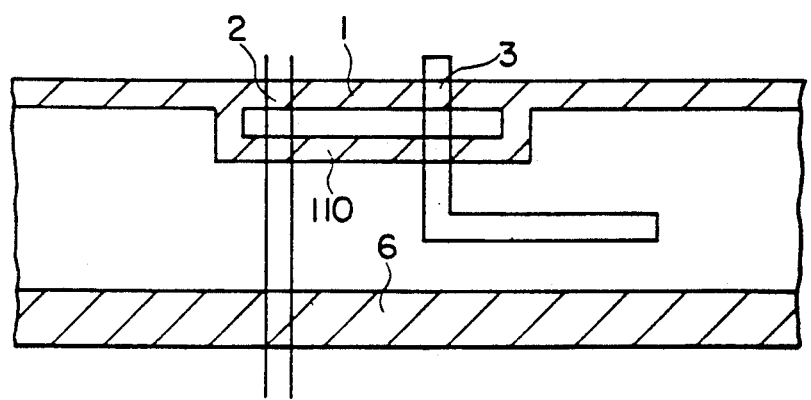
Figure 21C:
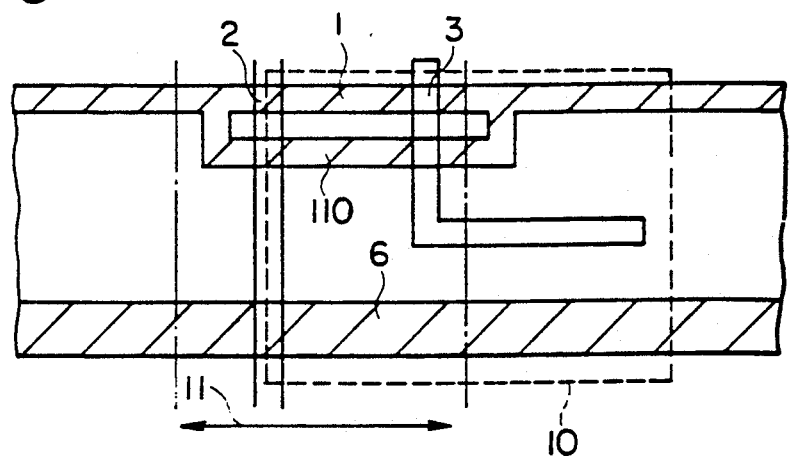

FIGS. 21A-C show patterns of a tenth embodiment of the present invention at its respective manufacturing steps. The feature of the embodiment is the parallel connection of TFTs based on provision of a bypass 110 to the gate electrode 1 to thereby provide a normal display signal to a pixel section even if any one of the TFTs malfunctions.

Figure 22:
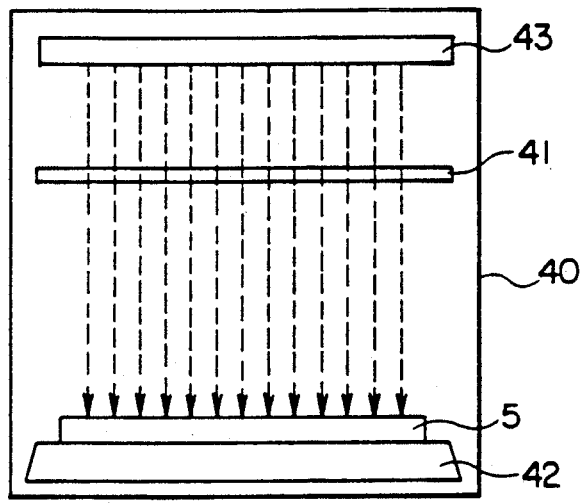
FIG. 22 diagrammatically shows the structure of a sputtering device with a stencil mask.
Figure 23:
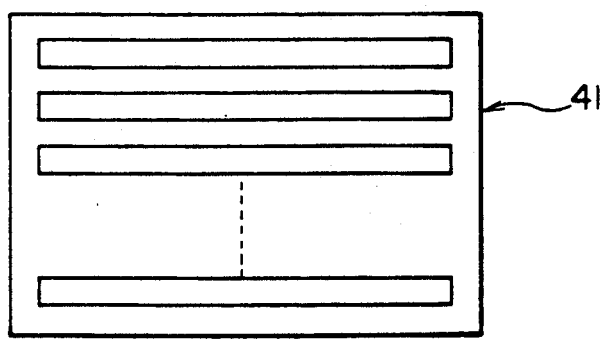
FIG. 23 shows a pattern of the stencil mask.

FIG. 22 diagrammatically shows a sputtering device 40 having a stencil mask. A stencil mask 41 (FIG. 23) is provided between a glass substrate 5 and an Al or Cr plate 43 with the stencil mask having the same pattern as, for example, the gate electrode to be formed by the mask. The glass substrate is held on a stage 42. Electrode material particles which are sputtered from the Al or Cr plate 43 are deposited on the glass substrate 5 to form a gate or a drain and a source electrode. Thus, the photolithographic process used conventionally is omitted. Therefore, the manufacturing throughput of the TFT is improved. This stencil mask is applicable to the vapor deposition device as well.

Figure 24:
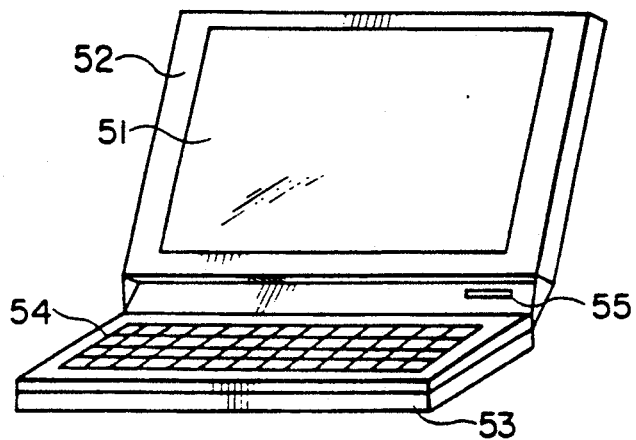
FIG. 24 is a perspective view of an applied example 1 using a reflective type liquid crystal display according to the present invention.

FIG. 24 shows an example of an inventive liquid crystal panel applied to a portable personal computer or a word processor. A liquid crystal panel 51 with the TFTs is provided in the cover 52, which is attached on hinges to a body 53 with a keyboard 54. When the cover 52 is closed, a box-like appearance without protrusions is provided to thereby make the computer or word processor convenient for portage. Provision of a light adjusting switch 55 in the opening/closing section of the cover 52 serves to reduce the size of the cover 52. When the liquid crystal panel 51 is of a reflective type, the cover 52 is thickened greatly. The liquid crystal panel 52 used may be a monochromatic one or a colored one.

Figure 25:
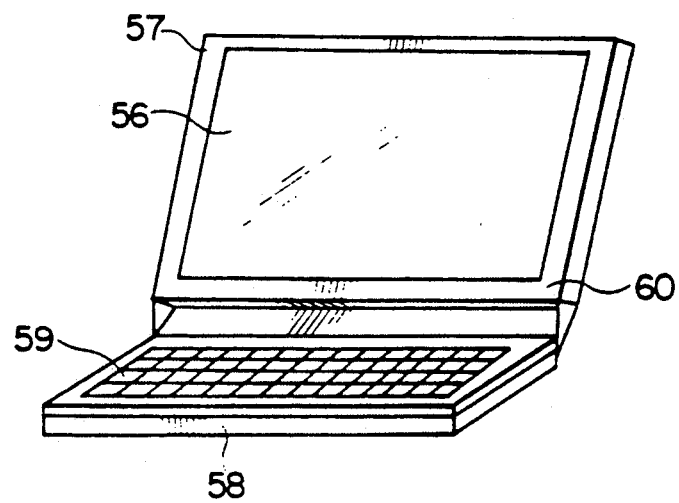
FIG. 25 is a perspective view of an applied example 2 using a reflective type liquid crystal display according to the present invention.

FIG. 25 shows another applied example of the present invention applied to a portable personal computer or a word processor. A reflective type color liquid crystal panel 56 is attached to a cover 57, which is attached on hinges to a body 58 with a keyboard 59. When the cover 57 is closed, a box-like appearance without protrusions is provided to thereby make the computer or word processor convenient for portage. An optical element 60 which monitors the brightness and color tone of the ambient light is attached to a lower portion of the cover 57 of the reflective type color liquid crystal panel 56. In the case of the reflective type color liquid crystal panel, the color tone of an image reproduced by the liquid crystal panel is changed depending on the quantity and color tone of the ambient light. Therefore, the optical element 60 measures the brightness and color tone of the ambient light to control a signal voltage applied to the liquid crystal panel to thereby reproduce an optimal color, which includes a reproducing a color closest to the color to be reproduced, as well as changing a reproduced color finally such that the user can clearly recognize a difference in color between the reproduced color and the ambient light when the ambient light has an extreme color tone. This method realizes optimal color reproduction even in the reflective type liquid crystal panel and the display is useable sufficiently in the respective works, for example, under a monochromatic light source.

Figure 26:
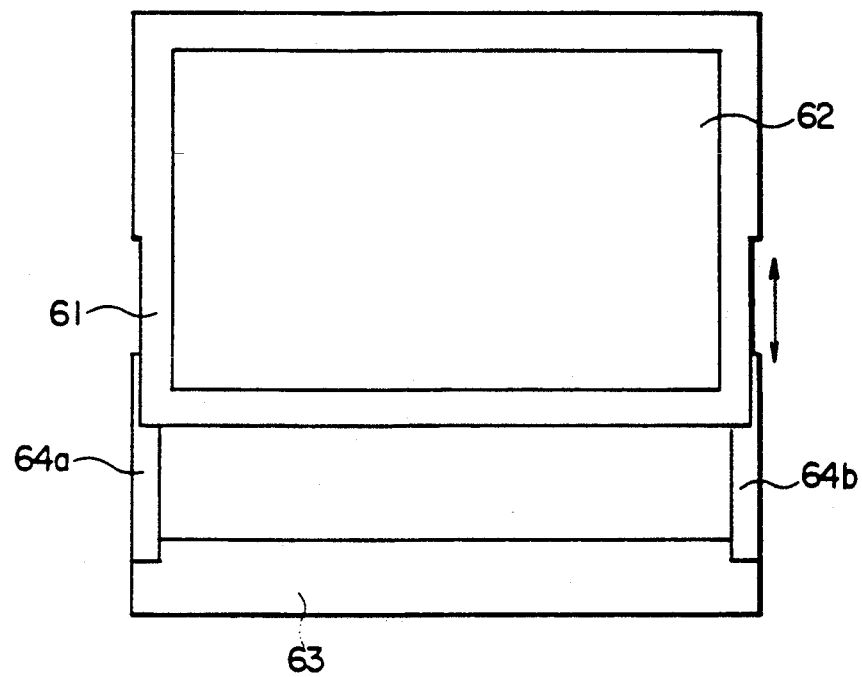
FIG. 26 is a perspective view of an applied example 3 using a reflective type liquid crystal display according to the present invention.

FIG. 26 shows an embodiment of a cover for a portable personal computer or word processor. The cover 61 has a reflective type liquid crystal panel 62 fitted therein. The body 63 has a keyboard (not shown) incorporated therein. A pair of arms 64a, 64b which connects the cover 61 and body 63 protrudes from the respective sides of the cover 61 such that the cover 61 is slidable vertically. Sliding the arms serves to set the liquid crystal panel at an optimal position.

Figure 27:
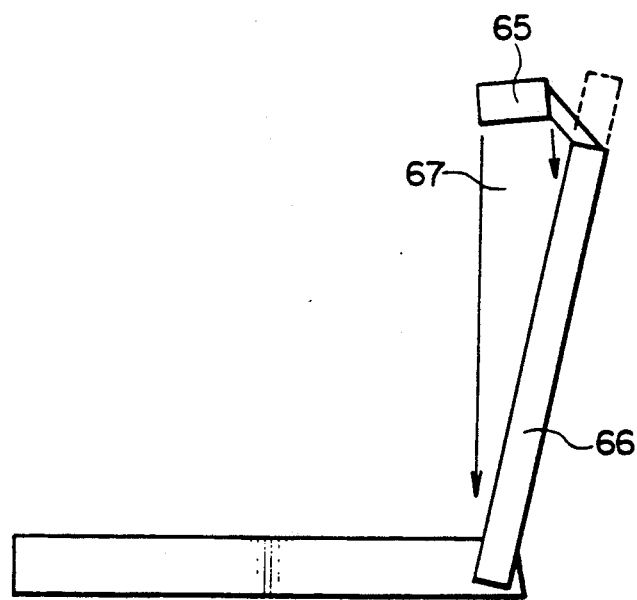
FIG. 27 is a perspective view of an applied example 4 using a reflective type liquid crystal display according to the present invention.

FIG. 27 shows an applied example of a reflective type liquid crystal panel applied to a portable personal computer or a word processor. The panel consumes low power, and is light and thin compared to a transmission type liquid crystal panel with a back light. Thus, it is preferable for the portable personal computer or word processor. However, it requires an external light source, so that the conditions of use of the panel may be limited due to insufficient quantity of light available. Some transmission type liquid crystal panels have a half-transmission type reflective plate disposed between a liquid crystal panel and a back light such that it can be used as a reflective type when no back light is on. However, it is not practical because the efficiency of utilization of light is low. In addition, when the back light is used, the efficiency of the back light is reduced by the half-transmission type reflective plate. Basically, the present embodiment uses a reflective type liquid crystal panel and incorporates in the cover 66 a front light 65 used when the quantity of ambient light is insufficient. In use, when the front light is drawn out and lighted, light 67 illustrates the panel front. The front light 65 constitutes a part of the cover 66 when it is not used.

According to the present invention, when a TFT substrate of an active matrix reflective type liquid crystal display is made, alignment of the respective layers is performed easily with high accuracy. Therefore, an error involved in the alignment in the design of TFTs is not required to be considered to thereby miniaturize the TFTs. A reduction in the area of the TFTs serves to increase the area of the storage capacitance electrode accordingly to thereby increase the storage capacitance value, so that the display is useable even in a liquid crystal having a small resistivity and hence a range of liquid crystal materials to be selected is large. A display mode of a low frame frequency is obtained compared to the use of the same liquid crystal material.

Since TFTs are made with high accuracy and high reproducibility, there are no variations among the characteristics of the TFTs in the display screen to thereby provide an active matrix reflective type liquid crystal display without uneven display.

A highly reliable low-cost active matrix reflective type liquid crystal display is provided in which the number of steps of manufacturing the TFT substrate is reduced to thereby improve the throughput.

What is claimed is:

1. A reflective type liquid crystal display including a plurality of scanning conductors, a plurality of signal conductors and a plurality of thin film transistors and reflective pixel electrodes provided in the vicinity of areas where the plurality of scanning conductors and the plurality of signal conductors intersect, comprising:
the thin film transistors having a reversely staggered structure where each transistor has a drain electrode comprising an area where a scanning conductor concerned and a signal conductor concerned intersect, a source electrode comprising an area where a short-circuiting conductor concerned parallel to the signal conductor and the scanning conductor intersect, a gate electrode comprising a region formed between the drain and source electrodes on the scanning conductor and a reflective electrode provided at an end of the short-circuiting conductor.

2. A reflective type liquid crystal display according to claim 1, further comprising a plurality of storage capacitance electrodes and an insulating layer provided between a respective one of storage capacitance electrodes and a reflective electrode concerned to form a storage capacitance.

3. A reflective type liquid crystal display according to claim 1, wherein the length of the short-circuiting conductors in the direction of extension of the plurality of signal conductors is larger than the width of the scanning conductors.

4. A reflective type liquid crystal display according to claim 3, wherein the short-circuiting conductor protrudes from the area where the scanning conductor concerned and the short-circuiting conductor intersect in the direction of the intersection.

5. A reflective type liquid crystal display according to claim 3, wherein the short-circuiting conductors each take substantially the form of L which includes sections parallel to the signal conductors and the scanning conductors.

6. A reflective type liquid crystal display according to claim 1, wherein at least part of the reflective electrode is formed on an organic passivation film.

7. A reflective type liquid crystal display according to claim 1, wherein a reflective electrode and a scanning conductor on which a thin film transistor which controls the reflective electrode is formed hold an insulating layer between the reflective electrode and an adjacent scanning conductor to form a storage capacitance.

8. A reflective type liquid crystal display according to claim 1, wherein a short-circuiting conductor and a corresponding reflective electrode are made integrally with each other by the same material.

9. A method of making a reflective type liquid crystal display with a plurality of scanning conductors, a plurality of signal conductors, a plurality of thin film transistors, a plurality of reflective pixel electrodes and a plurality of storage capacitances (Cstr) provided in the vicinity of areas where the corresponding plurality of scanning conductors and the corresponding plurality of signal conductors intersect, the method comprising the steps of:
(a) forming the scanning conductors;
(b) forming the signal conductors and a plurality of short-circuiting conductors which are parallel to the signal conductors and which intersect with the scanning conductors.

10. A method according to claim 9, wherein
the scanning conductor forming step comprises simultaneous formation of storage capacitance electrodes which each constitute a part of the storage capacitance.

11. A method according to claim 9, comprising the steps of:
forming a plurality of reflective electrodes concerned after the two steps.

* * * * *